United States Patent
Koo et al.

(10) Patent No.: US 7,173,378 B2
(45) Date of Patent: Feb. 6, 2007

(54) ACTIVE MATRIX ORGANIC ELECTROLUMINESCENT DISPLAY DEVICE HAVING ORGANIC THIN-FILM TRANSISTOR AND METHOD FOR MANUFACTURING THE DISPLAY DEVICE

(75) Inventors: Jae-Bon Koo, Suwon-si (KR); Min-Chul Suh, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 78 days.

(21) Appl. No.: 11/123,092

(22) Filed: May 6, 2005

(65) Prior Publication Data

US 2005/0285540 A1    Dec. 29, 2005

(30) Foreign Application Priority Data

Jun. 23, 2004    (KR) .................. 10-2004-0046944

(51) Int. Cl.
    *G09G 3/32*   (2006.01)
(52) U.S. Cl. ................... 315/169.3; 313/500
(58) Field of Classification Search ........ 313/500; 315/169.1, 169.3, 169.2; 445/24
See application file for complete search history.

(56) References Cited

U.S. PATENT DOCUMENTS

| | | | | |
|---|---|---|---|---|
| 6,570,323 B1 * | 5/2003 | Nakamata et al. | .......... | 313/500 |
| 6,888,520 B2 * | 5/2005 | Ouchi et al. | .......... | 345/82 |

\* cited by examiner

*Primary Examiner*—David Vu
(74) *Attorney, Agent, or Firm*—H.C. Park & Associates, PLC

(57) ABSTRACT

An active matrix electroluminescent (OEL) display device including a p-type organic thin-film transistor (TFT) is provided. This device has a high aperture ratio, and is easily produced in an array structure. The display device includes a counter electrode, an intermediate layer including at least a light emitting layer on the counter electrode, a pixel electrode formed on the intermediate layer, a first electrode that is disposed on the pixel electrode and insulated from the pixel electrode, a second electrode that is disposed on the pixel electrode and connected to the pixel electrode, a p-type organic semiconductor layer contacting the first electrode and the first drain electrode, and a first gate electrode that is disposed on the p-type organic semiconductor layer and insulated from the first electrode, the first drain electrode, and the p-type organic semiconductor layer.

16 Claims, 14 Drawing Sheets

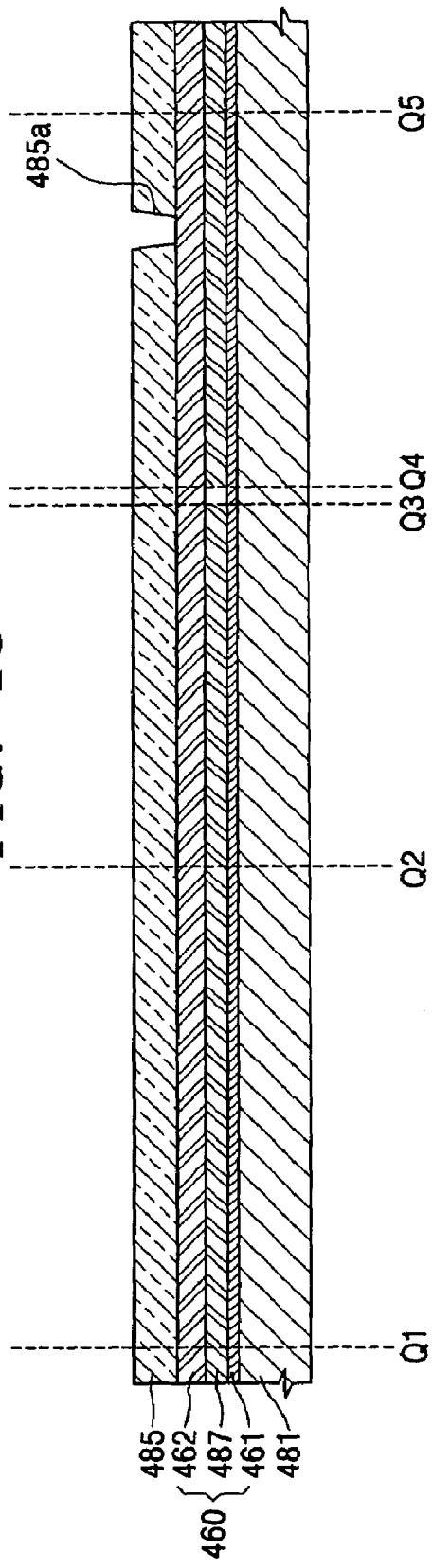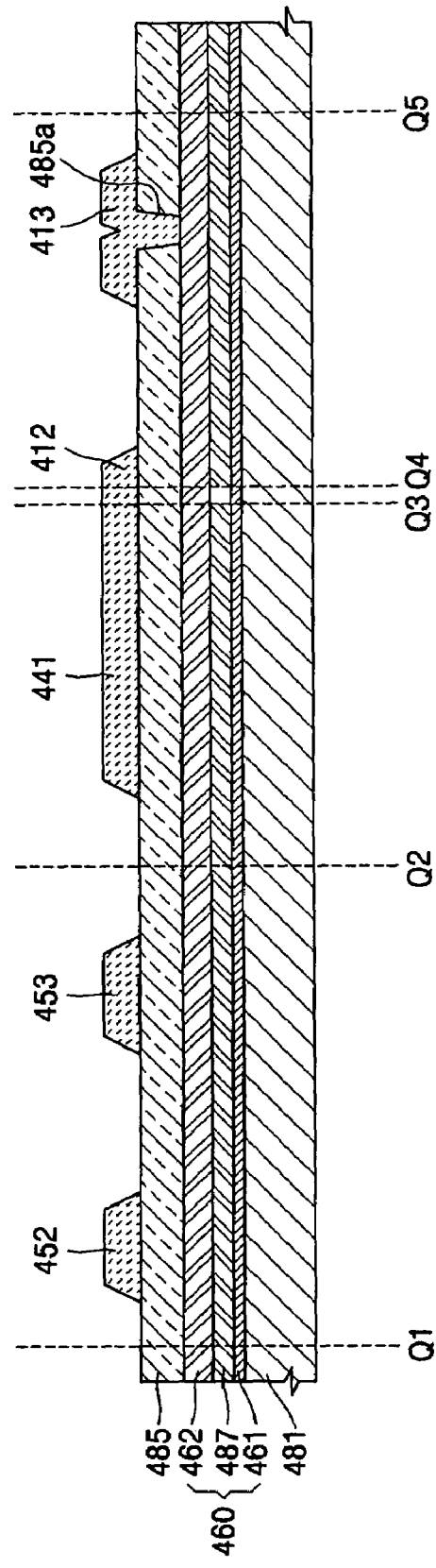

US 7,173,378 B2

ACTIVE MATRIX ORGANIC ELECTROLUMINESCENT DISPLAY DEVICE HAVING ORGANIC THIN-FILM TRANSISTOR AND METHOD FOR MANUFACTURING THE DISPLAY DEVICE

CROSS REFERENCE TO RELATED APPLICATION

This application claims priority to and benefit of Korean Patent Application No. 10-2004-0046944, filed on Jun. 23, 2004, in the Korean Intellectual Property Office, the disclosure of which is incorporated herein in its entirety by reference.

BACKGROUND OF THE INVENTION

1. Field of the Invention

The present invention relates to an active matrix organic electroluminescent (OEL) display device that has an organic thin-film transistor (OTFT), and more particularly, to an active matrix OEL display device, that has an array structure, including a p-type OTFT that has an aperture ratio of approximately 100%.

2. Description of the Related Art

FIG. 1 is a plan view of a sub-pixel unit in a conventional active matrix electroluminescent (EL) display device, and FIG. 2 is a cross-sectional view of the sub-pixel unit of the display device taken along line P1 through P7 of FIG. 1.

Referring to the drawings, in conventional silicon thin-film transistors (TFTs) 110 and 150 that have a semiconductor layer 180 formed of silicon, the semiconductor layer 180 includes a source region and a drain region which are heavily doped by impurities. In addition, it includes a channel region formed between the above two regions. In addition, the silicon TFTs 110 and 150 include gate electrodes 111 and 151 that are insulated from the semiconductor layer 180 and located to correspond to the channel region, source electrodes 112 and 152 and drain electrodes 113 and 153 that contact the source region and the drain region.

The problem with these conventional silicon TFTs 110 or 150 is that they are more expensive, fragile, and cannot use a plastic substrate since that they are fabricated at high temperature of 300° C. or higher, for example.

Flat panel display devices such as liquid crystal displays (LCD) or electroluminescent displays (ELD) use TFTs as switching devices and driving devices to control and operate pixels. In order to make flat panel display devices large, thin, and flexible, researchers are trying to use plastic substrates instead of the typical glass substrate. However, manufacturing display devices with plastic substrates is difficult because the fabrication temperature is below what is necessary for conventional silicon TFTs.

Since an OTFT does not have the above manufacturing problems, active research has been performed to develop OTFTs that have an organic semiconductor layer.

FIG. 3 is a schematic cross-sectional view of an OEL display device that has a conventional TFT.

Referring to FIG. 3, an OEL device 210 and an OTFT 220 are formed on a substrate 200. The OEL device 210 includes a transparent electrode 211, an organic light emitting layer 212, and a metal electrode 213 that are sequentially formed on the substrate 200. The OTFT 220 includes a gate electrode 221 formed on the substrate 200, a dielectric layer 222 formed on the gate electrode 221, an organic semiconductor layer 223 formed on the dielectric layer 222, and a source electrode 224 and a drain electrode 225 that are disposed on both sides of the organic semiconductor layer 223 on the dielectric layer 222. The drain electrode 225 is connected to the transparent electrode 211 and the organic light emitting layer 212 of the OEL device 210.

However, since the OEL device 210 is disposed adjacent to the OTFT 220, the OEL device 210 has low aperture ratio due to the size of the OTFT 220. When the aperture ratio is low, the light emitting intensity of each unit pixel of the display device must be increased, thus reducing the lifespan of the display device.

In order to solve the above problem, Korean Patent Publication No. 2003-0017748 discloses an active matrix OEL display device, in which an OTFT and an OEL device are stacked in a vertical direction. FIG. 4 is a cross-sectional view of an OEL display device that includes the OTFT disclosed in the above Patent Publication.

Referring to FIG. 4, an OEL device 310 and an OTFT 330 disposed on a substrate 300 are separated by a first insulating layer 320. The OEL device 310 includes a transparent electrode 311, an organic light emitting layer 312, and a metal electrode 313 sequentially formed on the substrate 300. The OTFT 330 includes a gate electrode 331 formed on the first insulating layer 320, a second insulating layer 332 formed on the gate electrode 331, a source electrode 334 and a drain electrode 335 formed on the second insulating layer 332, and an organic semiconductor layer 333 connected to the source and drain electrodes 334 and 335. In addition, the source electrode 334 is connected to the metal electrode 313.

However, the above example is merely an OEL device that includes one OTFT, not an array of a plurality of OEL devices and a plurality of OTFTs. In addition, complex processes are required to fabricate the OTFT 330 with such a complex inverted coplanar structure. Therefore, it is difficult to form the active matrix OEL display device that can be applied in actual situation.

SUMMARY OF THE INVENTION

The present invention provides an active matrix organic electroluminescent (OEL) display device that has an organic thin-film transistor (TFT), and an aperture ratio of approximately 100%.

Additional features of the invention will be set forth in the description which follows, and in part will be apparent from the description, or may be learned by practice of the invention.

The present invention discloses an active matrix OEL display device that includes an organic thin-film transistor, a counter electrode, an intermediate layer including at least a light-emitting layer on the counter electrode, and a pixel electrode formed on the intermediate layer. In addition, the device includes a first electrode disposed on and insulated from the pixel electrode, a second electrode disposed on and connected to the pixel electrode, a p-type organic semiconductor layer contacting the first electrode and the first drain electrode, and a first gate electrode disposed on the p-type organic semiconductor layer that is insulated from the first electrode, the first drain electrode, and the p-type organic semiconductor layer.

The present invention also provides a method of fabricating an active matrix OEL display device including an organic thin-film transistor. The method involves forming a counter electrode on the entire surface of a substrate or in a predetermined pattern, forming an intermediate layer including at least a light emitting layer on the counter electrode, forming a pixel electrode of a predetermined pattern on the intermediate layer, and forming a protective layer covering the pixel electrode on the entire surface of the substrate. The process also includes forming a first contact hole on the protective layer so as to expose the pixel electrode, forming a second electrode connected to the pixel electrode through the first contact hole, a first electrode and a first capacitor electrode formed integrally with each other, a fourth electrode, and a third electrode on the protective layer. The process also includes forming a p-type organic semiconductor layer covering the electrodes on the entire surface of the substrate, forming a gate insulating layer on the p-type organic semiconductor layer entirely over the substrate, forming a second contact hole in the p-type organic semiconductor layer and the gate insulating layer so as to expose the fourth electrode, and forming a first gate electrode, a second capacitor electrode connected to the fourth electrode through the second contact hole, and a second gate electrode on the gate insulating layer.

It is to be understood that both the foregoing general description and the following detailed description are exemplary and explanatory and are intended to provide further explanation of the invention as claimed.

BRIEF DESCRIPTION OF THE DRAWINGS

The above and other features and advantages of the present invention will become more apparent by describing in detail exemplary embodiments thereof with reference to the attached drawings.

FIG. 15, FIG. 16, FIG. 17, and FIG. 18 are schematic cross-sectional views of processes for fabricating the active matrix OEL display device that includes the OTFT according to the present invention.

DETAILED DESCRIPTION OF THE INVENTION

Figure 1:
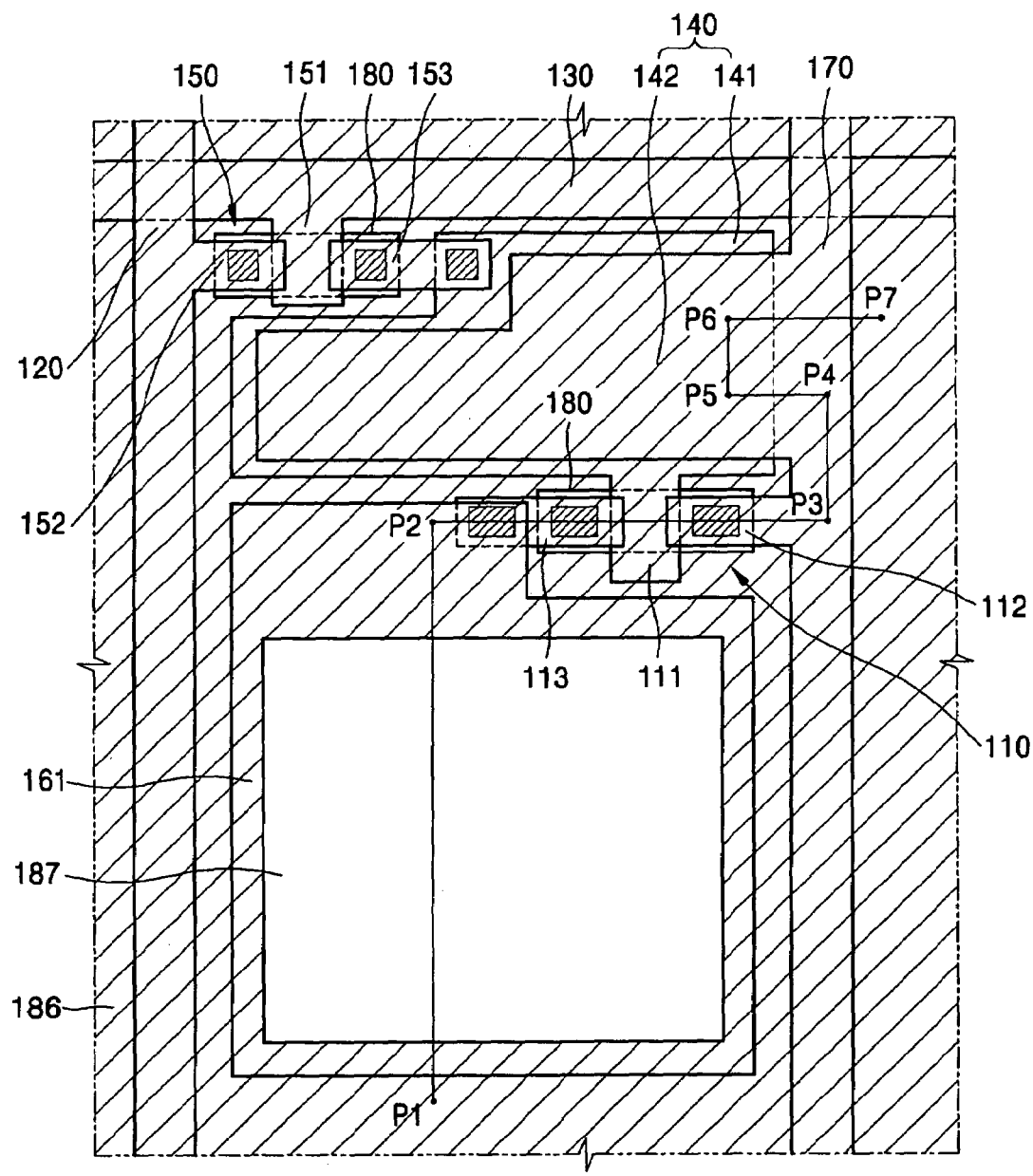
FIG. 1 is a plan view of a sub-pixel unit in a conventional active matrix electroluminescent (EL) display device.
Figure 2:
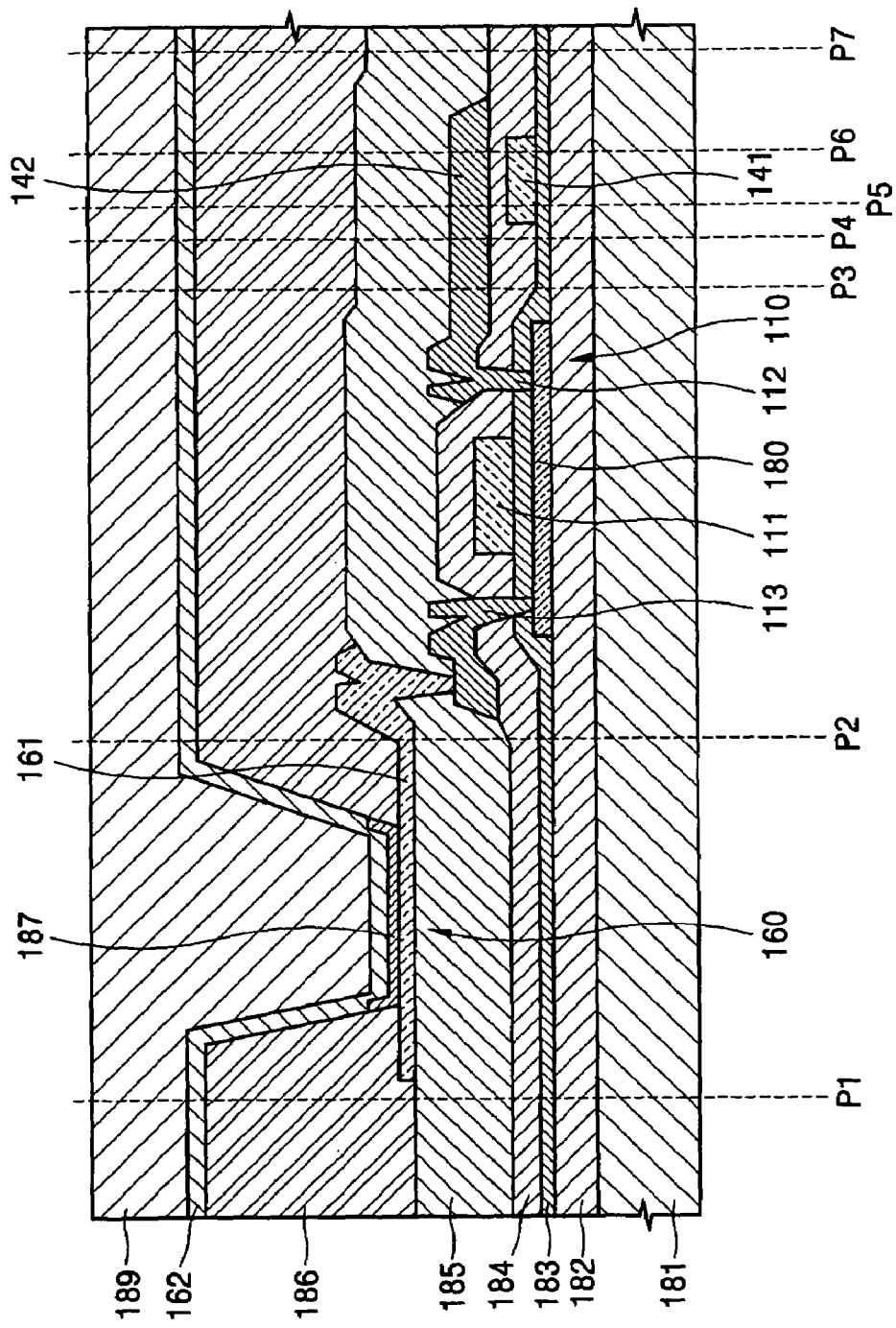
FIG. 2 is a cross-sectional view of the sub-pixel unit of the display device taken along line P1 through P7 of FIG. 1.
Figure 3:
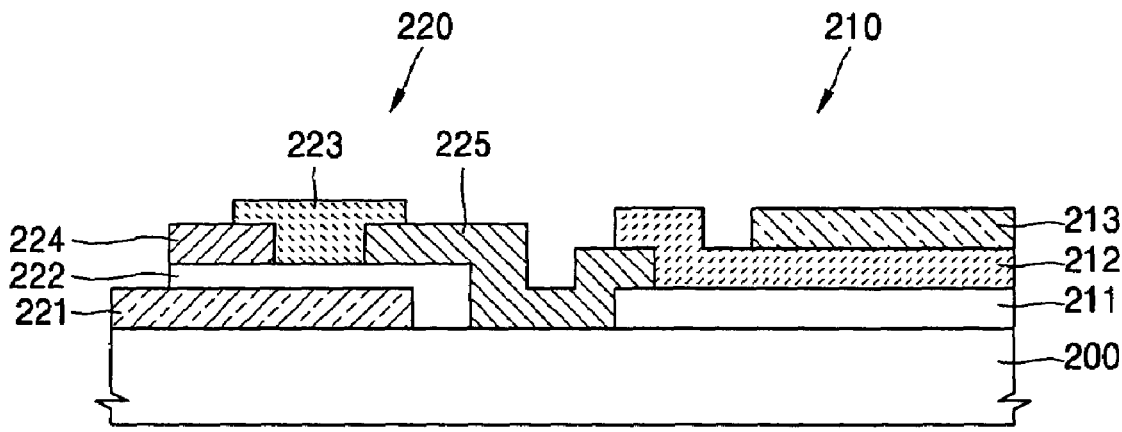
FIG. 3 is a schematic cross-sectional view of an OEL display device that includes the conventional thin-film transistor (TFT).
Figure 4:
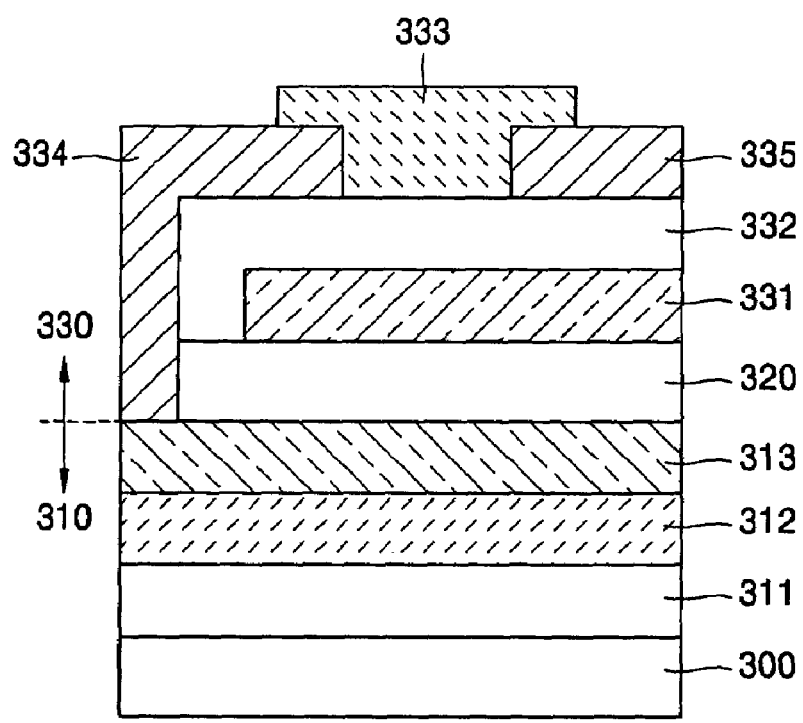
FIG. 4 is a schematic cross-sectional view of an OEL display device that includes the OTFT according to the conventional art.
Figure 5:
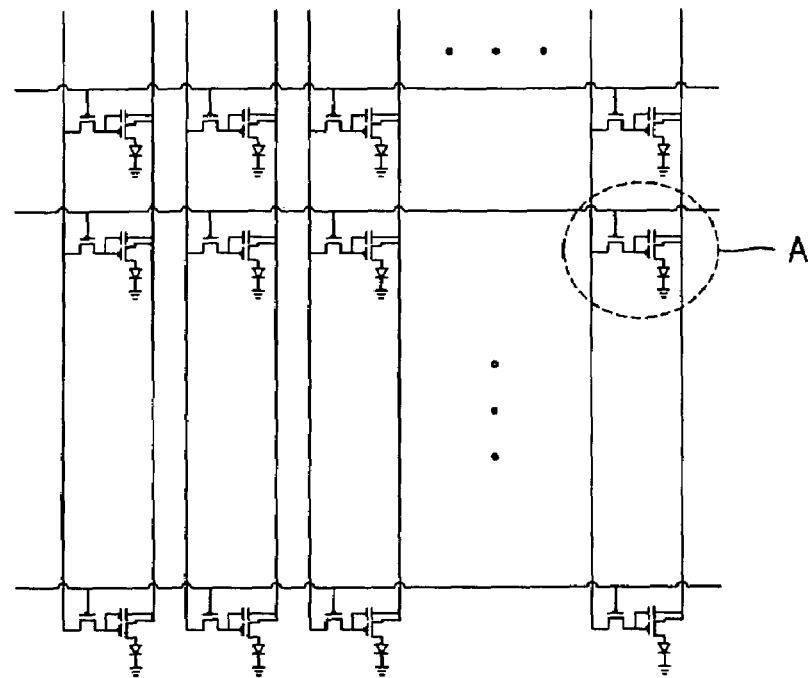
FIG. 5 is a schematic circuit diagram of an active matrix EL display device that includes a p-type OTFT according to a first embodiment of the present invention.
Figure 6:
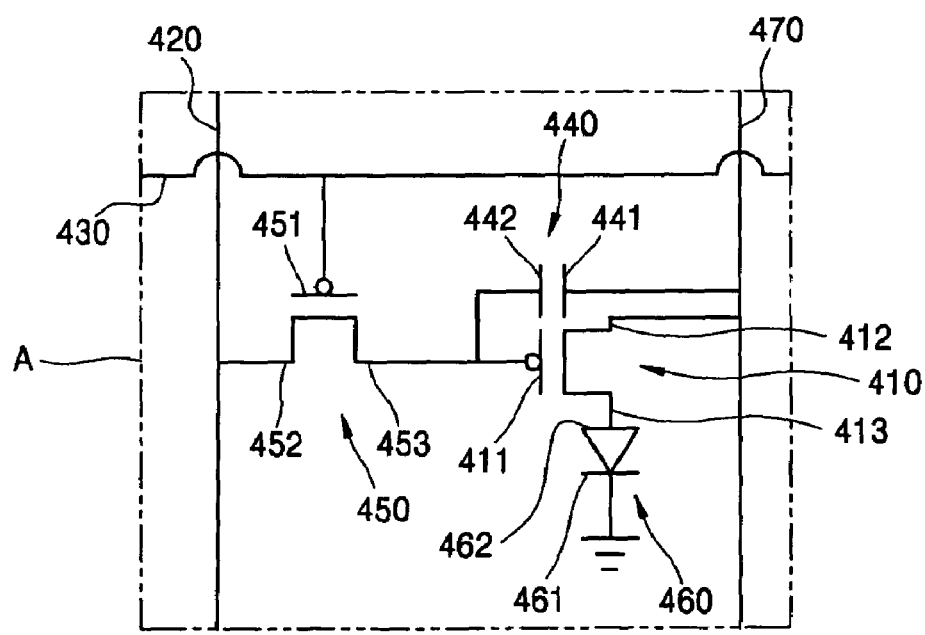
FIG. 6 is a circuit diagram of part "A" in FIG. 5.
Figure 7:
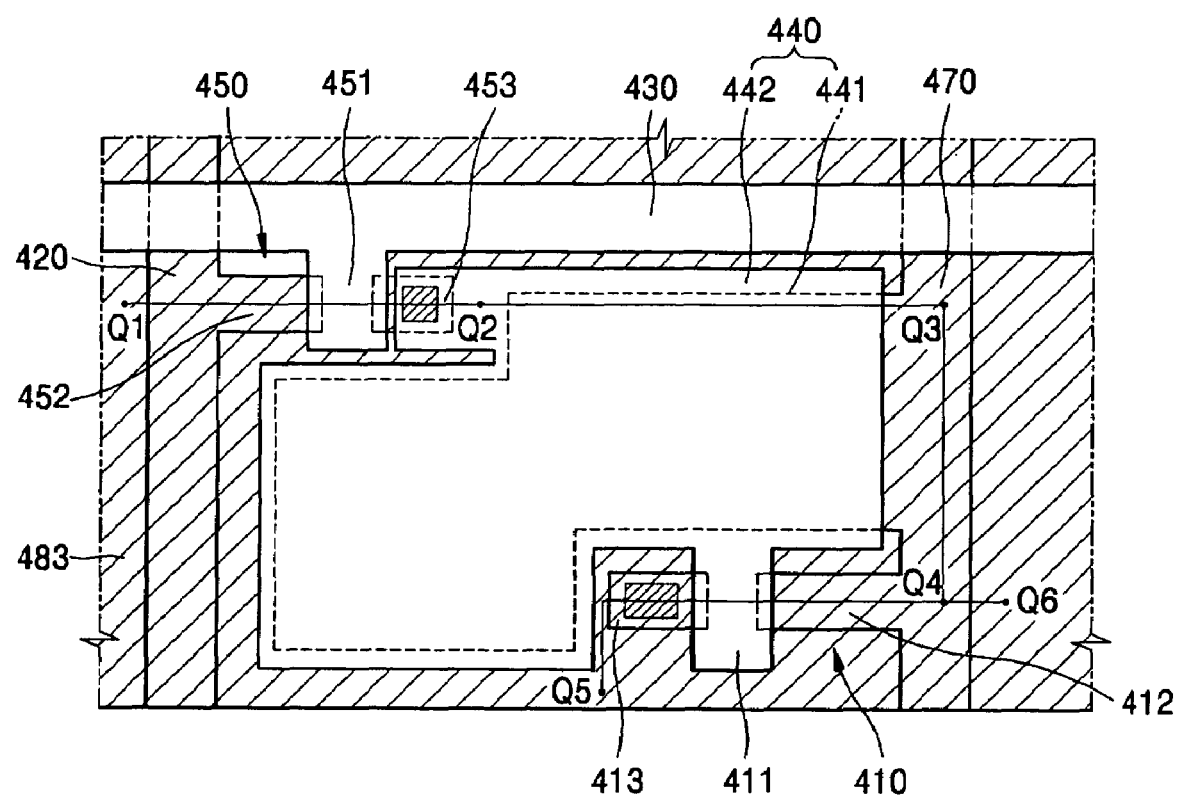
FIG. 7 is a schematic plan view of a sub-pixel unit of the active matrix OEL display device including the p-type OTFT.
Figure 8:
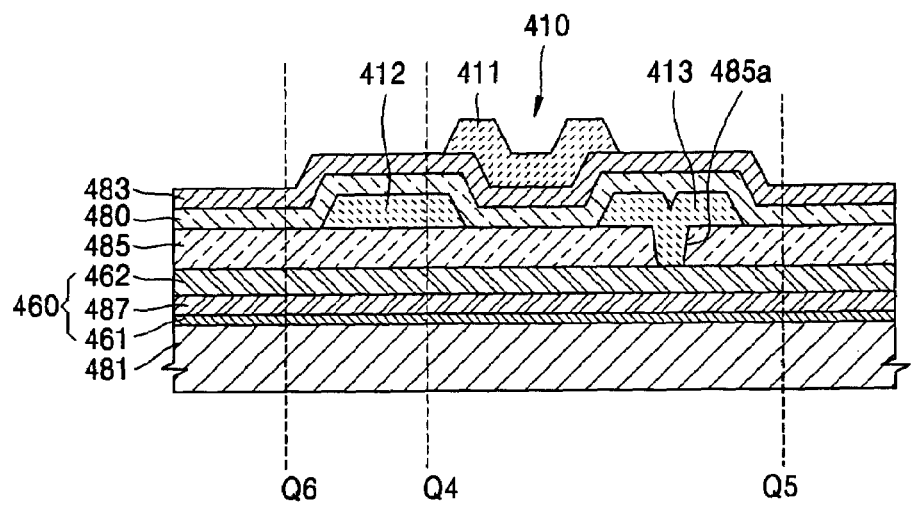
FIG. 8 is a cross-sectional view of the sub-pixel unit of the active matrix OEL display device that includes the p-type OTFT taken along line Q5 and Q6 of FIG. 7.
Figure 9:
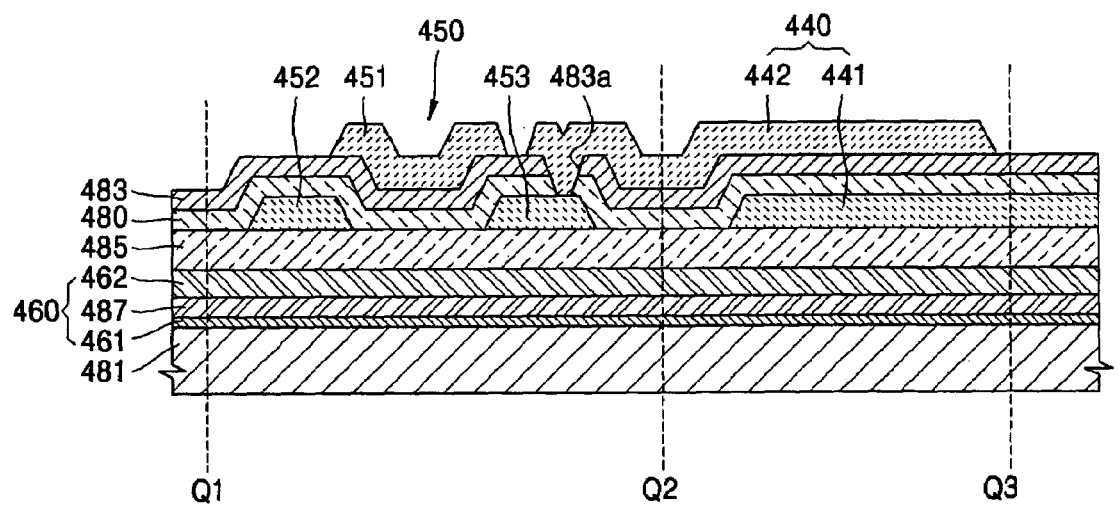
FIG. 9 is a schematic cross-sectional view of the sub-pixel unit of the active matrix OEL display device that includes the p-type OTFT taken along line Q1 through Q3 of FIG. 7.
Figure 10:
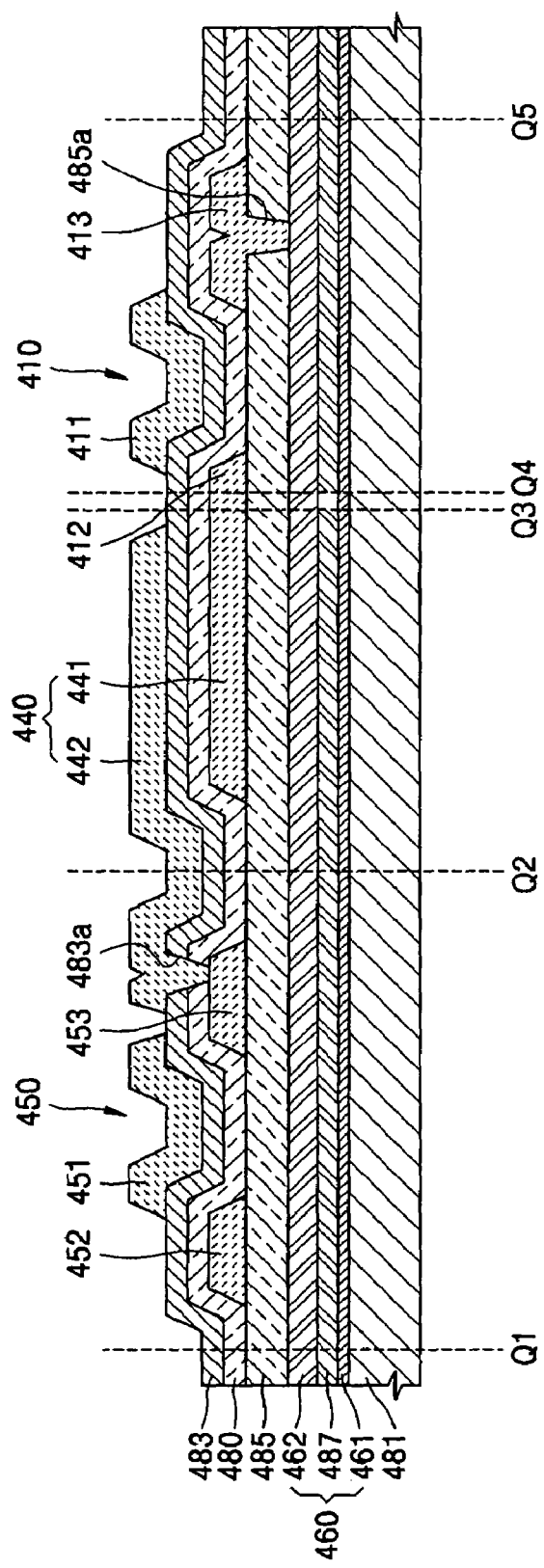
FIG. 10 is a schematic cross-sectional view of the sub-pixel unit of the active matrix OEL display device that includes the p-type OTFT taken along line Q1 through Q5 of FIG. 7

FIG. 5 is a schematic circuit diagram of an active matrix electroluminescent (EL) display device that includes a p-type organic thin-film transistor (TFT) according to a first embodiment of the present invention. FIG. 6 is a circuit diagram of part "A" in FIG. 5. FIG. 7 is a schematic plan view of a sub-pixel unit of the active matrix OEL display device that includes the p-type OTFT. FIG. 8 is a cross-sectional view of the sub-pixel unit of the active matrix OEL display device that includes the p-type OTFT taken along line Q5 and Q6 of FIG. 7. FIG. 9 is a schematic cross-sectional view of the sub-pixel unit of the active matrix OEL display device that includes the p-type OTFT taken along line Q1 through Q3 of FIG. 7. In addition, FIG. 10 is a schematic cross-sectional view of the sub-pixel unit of the active matrix OEL display device that includes the p-type OTFT taken along line Q1 through Q5 of FIG. 7.

An EL display device includes various pixel patterns according to the color of the emitted light at a light-emitting layer. The EL device is a current-driving light-emitting device that emits red, green, or blue light depending on the current flow between both electrodes to display a predetermined image.

The EL device includes a counter electrode, an intermediate layer including at least a light emitting layer formed on an upper portion of the counter electrode, and a pixel electrode on the intermediate layer. The present invention is not limited to the above structure, however, various structures of EL devices can be applied.

A flat panel display device using the EL device of the present invention has the advantages of superior brightness, higher contrast, and wider viewing angle than those of the conventional display device.

Referring to FIG. 5 and FIG. 6, each sub-pixel unit includes a second OTFT 450 that is driven by a driving circuit, a first OTFT 410 driven by the second OTFT 450, and an OEL device 460 driven by the first OTFT 410.

A third electrode 452 of the second OTFT 450 is connected to the driving circuit through a first conducting line 420. A second gate electrode 451 of the second OTFT 450 is connected to the driving circuit through a second conducting line 430, and a fourth electrode 453 of the second OTFT 450 is connected to a second capacitor electrode (upper electrode, 442) of a storage capacitor 440 and a first gate electrode 411 of the first OTFT 410.

In the above structure, the first conducting line 420 can be a data line and a second conducting line 430 can be a scan line. The second OTFT 450 functions as a switching transistor and the first OTFT 410 functions as a driving transistor. In the above selection driving circuit, two or more transistors can be used. In the following examples, a driving circuit includes two transistors, that is, a switching transistor and a driving transistor.

Referring to FIG. 6 and FIG. 7, a first capacitor electrode (lower electrode 441) of the storage capacitor 440 and the first electrode 412 of the first OTFT 410 are connected to a third conducting line 470. The second electrode 413 of the first OTFT 410 is connected to the pixel electrode 462 of the OEL device 460. As shown in FIG. 6, the counter electrode 461 of the OEL device 460 faces the pixel electrode 462 with a predetermined gap therebetween. An intermediate layer including at least a light emitting layer is disposed between the counter and pixel electrodes 461 and 462.

In FIG. 7, the OTFTs 410 and 450 are disposed on right lower portion and left upper portion of the sub-pixel unit, and the storage capacitor 440 is disposed between the OTFTs 410 and 450. However, the OTFTs 410 and 450 can be disposed parallel to each other on the upper or lower portion of the sub-pixel unit, and more OTFTs can be formed.

FIG. 7, FIG. 8, and FIG. 9 show physical structures of part "A" shown in FIG. 5 and FIG. 6. FIG. 7 shows the first conducting line 420 and the second conducting line 430 that are not shown in FIG. 8 and FIG. 9. FIG. 8 and FIG. 9 show a substrate 481, a gate insulating layer 483, a protective layer 485, and a pixel electrode 462 that are not shown in FIG. 7.

Referring to the drawings, when a scan signal is applied to the second gate electrode 451 by the driving circuit, a conductive channel is formed on the p-type organic semiconductor layer 480 that connects the third electrode 452 and the fourth electrode 453. When a data signal is supplied to the third electrode 452 by the first conducting line 420, the data signal is transmitted to the storage capacitor 440 and to the first TFT 410. In addition a conductive channel is formed on the p-type organic semiconductor layer that connects the first electrode 412 and second electrode 413. Then, a signal from the third conducting line 470 is transmitted to the pixel electrode 462.

Referring to FIG. 8, FIG. 9, and FIG. 10, detailed structure of the sub-pixel unit will be described.

Referring to FIG. 8, the counter electrode 461 is disposed on the entire upper surface of the substrate 481 and the intermediate layer 487 including at least the light emitting layer is formed on the counter electrode 461. The pixel electrode 462 is disposed on the intermediate layer 487. In the present invention, the p-type first OTFT 410 is connected to the OEL device 460, and the second electrode 413 of the p-type first OTFT 410 is connected to the pixel electrode 462 of the OEL device 460. Thus, the pixel electrode 462 becomes an anode, and the counter electrode 461 corresponding to the pixel electrode 462 becomes a cathode. In following descriptions, OTFT means the p-type OTFT.

When the OEL device is a backlight emission type, the substrate 481 and the counter electrode 461 are formed of a transparent material, and the pixel electrode 462 is formed of a metal that has a high light reflectivity. When the OEL device is a front emission type, the counter electrode 461 is formed of a metal that has a high light reflectivity, and the pixel electrode 462, a protective layer 485, an organic semiconductor layer 480, and a gate insulating layer 483 that will be described later can be formed of a transparent material. The EL device of the present invention may be the backlight emission type, the front emission type, or the dual-emission type, where the light generated by the EL device can exit in at least one direction between the counter and pixel electrodes 461 and 462.

If the counter electrode 461 is formed of a transparent material, the counter electrode 461 can be used as a cathode. Therefore, an auxiliary electrode or a bus electrode line is formed of a material for forming a transparent electrode such as an indium tin oxide (ITO), indium zinc oxide (IZO), ZnO, or In$_2$O$_3$. A metal with a small work function such as Li, Ca, LiF/Ca, LiF/Al, Al, Ag, Mg, or a compound thereof, for example, is deposited to form a metal layer of semi-permeability, thereby forming the counter electrode 461 with a dual structure. When the counter electrode 461 is used as a reflective electrode, Li, Ca, LiF/Ca, LiF/Al, Ag, Mg, or a compound thereof, for example, is deposited entirely to be thick to form the counter electrode 461.

The counter electrode 461 can cover all of the sub-pixels, or correspond to each sub-pixel.

When the pixel electrode 462 is formed of the transparent material, the pixel electrode 462 can be formed of the ITO, IZO, ZnO, or In$_2$O$_3$, for example. If the pixel electrode 462 is used as the reflective electrode, the electrode is formed of ITO, IZO, ZnO, or In$_2$O$_3$, and a thick reflective layer with low resistance, including, but not limited to Ag, Mg, Al, Pt, Pd, Au, Ni, Nd, Ir, Cr, or a compound thereof is deposited thereon. When the pixel electrode 462 is used as the reflective layer, Au, Ni, Pt, or Pd, for example, can be used to form the electrode.

The pattern of the pixel electrode can be formed to correspond to the sub-pixel. However, the shape of pattern is not limited thereto, and an organic material such as a conductive polymer can be used as the counter and pixel electrodes.

The OEL device 460 includes the pixel electrode 462 that receives the signal from the second electrode 413 of the first OTFT 410, the counter electrode 461, and the intermediate layer 487 with the light-emitting layer, which is disposed between the pixel electrode 462 and the counter electrode 461. The intermediate layer 487 is formed of an organic material.

The OEL device 460 can be a low-molecular weight organic layer or a high-molecular weight organic layer depending on the type of the organic material used. When a low-molecular weight organic layer is used to form the OEL device 460, the intermediate layer can include a hole injection layer (HIL), a hole transport layer (HTL), an emission layer (EML), an electron transport layer (ETL), and an electron injection layer (EIL) that is stacked in single or multiple structure. An organic material such as copper phthalocyanine (CuPc), N,N-Di(naphthalene-1-yl)-N,N'-diphenyl-benzidine (NPB), or tris-8-hydroxyquinoline aluminum (Alq3) can be used. When an electric charge is applied to the pixel electrode and the counter electrode, the holes and electrons combine to generate excitons. When the excitons fall from an excited state to ground state, they cause the light-emitting layer to emit light.

As described above, since the pixel electrode 462 becomes the anode and the counter electrode 461 becomes the cathode, the intermediate layer 487 can include the HIL, HTL, EML, EIL, and ETL sequentially from the pixel electrode 462. The intermediate layer 487 can also include additional layers.

A low-molecular weight organic layer can be formed by heating and depositing the organic material under a vacuum atmosphere. The structure of the intermediate layer is not limited to the above example, but can include various layers if necessary.

When a high-molecular weight organic layer is used as the intermediate layer 487, the intermediate layer 487 can include the HTL and EML. As described above, since the pixel electrode 462 becomes the anode and the counter electrode 461 becomes the cathode, the intermediate layer 487 can include the HTL and EML sequentially from the pixel electrode 462.

The high-molecular weight HTL can be formed of poly-(2,4)-ethylene-dihydroxy thiopene (PEDOT) or polyaniline (PANI) using an inkjet printing or spin coating method. The high molecular weight organic light emitting layer can be formed of a poly-phenylenevinylene (PPV), soluble PPV, Cyano-PPV, or polyfluorene, and a color pattern can be formed by a conventional method such as inkjet printing, spin coating, or a thermal transfer method using a laser. The structure of the intermediate layer is not limited to the above example, and various layers can be included.

The protective layer 485 is formed on the OEL device 460 with the above structure and a first contact hole 485a is formed on the protective layer 485 so that the pixel electrode 462 can be exposed through the contact hole 485a. The second electrode 413 is formed on a predetermined region including the region where the first contact hole 485a is formed. The second electrode 413 is connected to the pixel electrode 462 of the OEL device 460 through the first contact hole 485a formed on the protective layer 485.

The first OTFT 410 is formed on the protective layer 485, and in the OEL display device according to the present invention, the first OTFT 410 is the p-type OTFT.

The structure of the first OTFT 410 will be described with reference to FIG. 8.

The first electrode 412 and the second electrode 413 are formed on the protective layer 485 by sputtering, photolithography, or deposition method. Since the highest occupied molecular obit (HOMO) level of a p-type organic semiconductor layer 480 that will be described is about 5 eV, the work functions of the first electrode 412 and the second electrode 413 are larger than the HOMO level of the p-type organic semiconductor layer 480. This allows the p-type organic semiconductor layer 480 and the first electrode 412 and the second electrode 413 formed of metal to ohmic contact each other. Therefore, it is desirable that the first electrode 412 and the second electrode 413 of the first OTFT 410 are formed of Au, Pt, Pd, Ni, Rh, Ir, or Os, and the like having large work function.

The p-type organic semiconductor layer 480 is formed on the first electrode 412 and the second electrode 413. The p-type organic semiconductor layer 480 is formed of a-hexathienylene (a-6T), dihexyl-a-6T (DH-a-a-6T), pentacene, poly-thienylenevinylene (PTV), poly-3-hexylthiophene regioregular (P3HT), or CuPc, for example using a vacuum deposition or thermal deposition method.

A gate insulating layer 483 is formed on the p-type OTFT 480. The gate insulating layer 483 can be formed of an organic material including, but not limited to PI, perylene, acrylate-based polymer (PMMA), epoxy, PS, PE, PP, PTFE, PPS, PC, PET, PVC, BCB, PVP, PAN, PVA, or phenolic resin.

The first gate electrode 411 is formed on the gate insulating layer 483. The first gate electrode 411 can be formed of various conductive materials such as a metal, MoW, Al, Cr, or Al/Cu, or a conductive polymer. Possible methods of forming the electrode include sputtering, photolithography, or inkjet deposition. A part of the first gate electrode 411 can overlap with the first electrode 412 and the second electrode 413 as shown in FIG. 8, however, it is not limited thereto.

As described above, when the OEL device 460 is formed on the substrate 481 and the first OTFT 410 is formed on the OEL device 460, an aperture ratio of approximately 100% can be ensured in the backlight emission displays, in which the light generated by the OEL device 460 exits through the substrate 481. Especially, since electric charge mobility in the OTFT is low the OTFT must have a large size in order to increase the on-current level. Therefore, when the OTFT is disposed on the same plane as the OEL device, the aperture ratio may be reduced. However, when the OTFT is disposed on the OEL device according to the present invention, the aperture ratio is not reduced even when the size of the OTFT increases.

In addition, the staggered type OTFT 410 includes the first electrode 412, the second electrode 413, the p-type organic semiconductor layer 480, the gate insulating layer 483, and the first gate electrode 411 formed on the first electrode 412 and the second electrode 413. Thus the second electrode 413 of the first OTFT 410 and the pixel electrode 462 of the OEL device 460 can be connected easily. That is, since the contact hole 485a is formed on the protective layer 485 that is disposed between the OEL device 460 and the first OTFT 410, the second electrode 413 and the pixel electrode 462 of the OEL device 460 can be connected to each other through the contact hole 485a.

Structures of a second OTFT 450 and a storage capacitor 440 that are connected to the first OTFT 410 and the OEL device 460 will be described with reference to FIG. 9.

Referring to FIG. 9, the structure of the second OTFT 450 is the same as that of the first OTFT 410. The storage capacitor 440 includes a first capacitor electrode 441 connected to the first electrode 412 of the first OTFT 410, and a second capacitor electrode 442 facing the first capacitor electrode 441 and connected to the fourth electrode 453 of the second OTFT 450 and the first gate electrode 411 of the first OTFT 410. The first capacitor electrode 441 can be formed integrally with the first electrode 412, and the second capacitor electrode 442 can be formed integrally with the first gate electrode 411.

The p-type organic semiconductor layer 480 and the gate insulating layer 483 are located between the first capacitor electrode 441 and the second capacitor electrode 442. The p-type organic semiconductor layer 480 and the gate insulating layer 483 function as dielectrics. In addition, the second capacitor electrode 442 is connected to the fourth electrode 453 of the second OTFT 450 through a second contact hole 483a formed in the p-type semiconductor layer 480 and the gate insulating layer 483.

The storage capacitor 440 having the above structure maintains the electric current flowing toward the pixel electrode 462 or increases driving speed.

FIG. 10 is a schematic cross-sectional view of the first OTFT 410, the storage capacitor 440, and the second OTFT 450 of the sub-pixel unit, taken along line Q1 through Q5 of FIG. 7, in the active matrix OEL display device including the OTFT according to the present invention.

Referring to FIG. 10, the first electrode 412 and the second electrode 413 of the first OTFT 410, the first capacitor electrode 441 of the storage capacitor 440, and the third electrode 452 and the fourth electrode 453 of the second OTFT 450 are each formed in the same plane. In addition, the first gate electrode 411 of the first OTFT 410, the second capacitor electrode 442 of the storage capacitor 440, and the second gate electrode 451 of the second OTFT 450 are each formed in the same plane.

Since the first OTFT 410, the storage capacitor 440, and the second OTFT 450 have the above described structures, the array of the active matrix OEL display device including the switching transistor, the driving transistor, which are formed by the OTFTs, and the storage capacitor can be formed easily. In addition, referring to FIG. 10, since the OEL device 460 is formed under the OTFTs and the storage capacitor, an aperture ratio of approximately 100% can be ensured in the backlight emission display.

Since the OTFT can be fabricated by a low-temperature fabricating process, an OEL display device that does not affect the OEL device 460 and the substrate 481 can be fabricated. Then, the counter electrode 461 of the OEL device 460 is the transparent electrode, and the pixel electrode 462 is the reflective electrode.

Figure 11:
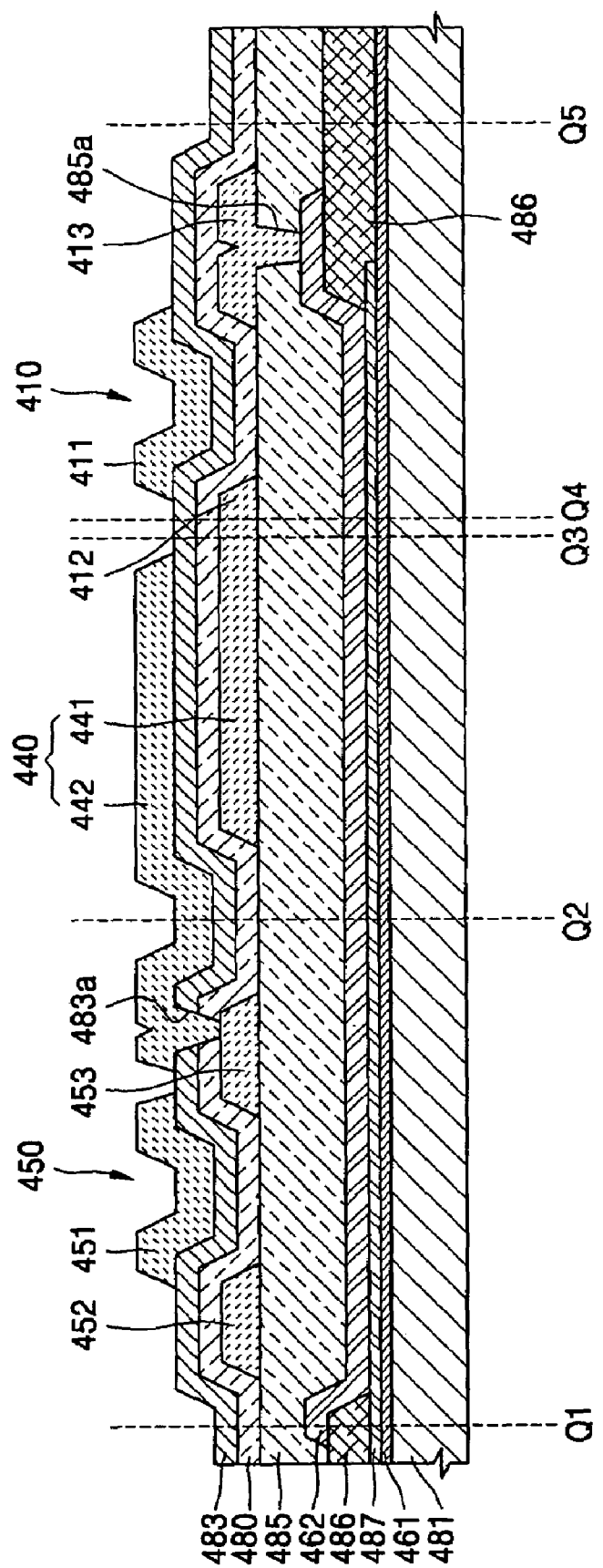
FIG. 11 is a cross-sectional view of a sub-pixel unit in an active matrix OEL display device that includes an OTFT according to a second embodiment of the present invention.

FIG. 11 is a cross-sectional view of a sub-pixel unit in an active matrix OEL display device that includes an OTFT according to a second embodiment of the present invention.

Referring to FIG. 11, the OEL device includes the counter electrode 461 on the substrate 481, and the intermediate layer 487 including the light emitting layer, and the pixel electrode 462. In addition, two staggered p-type OTFTs 410 and 450, and the storage capacitor 440 are formed on the OEL device. The second electrode 413 of the first OTFT between the two p-type OTFTs 410 and 450 is connected to the pixel electrode 462 of the OEL device. The above structure is the same as that of the first embodiment.

A difference between the present embodiment and the above described first embodiment is that a pixel definition layer 486 is formed on the counter electrode 461. That is, the sub-pixels formed of the OEL devices are divided by the pixel definition layer 486. The pixel definition layer 486 increases a gap between the edge of the pixel electrode 462 and the counter electrode 461 at each sub-pixel and defines the light emitting region between the sub-pixels on the counter electrode 461. Thus, the pixel definition layer 486 prevents the intermediate layer 487 including the light emitting layer from being cut around the edge of the pixel electrode 462 or the electric field from being concentrated at the edge of the pixel electrode 462. This configuration also prevents the short circuit of the counter and pixel electrodes 461 and 462.

Figure 12:
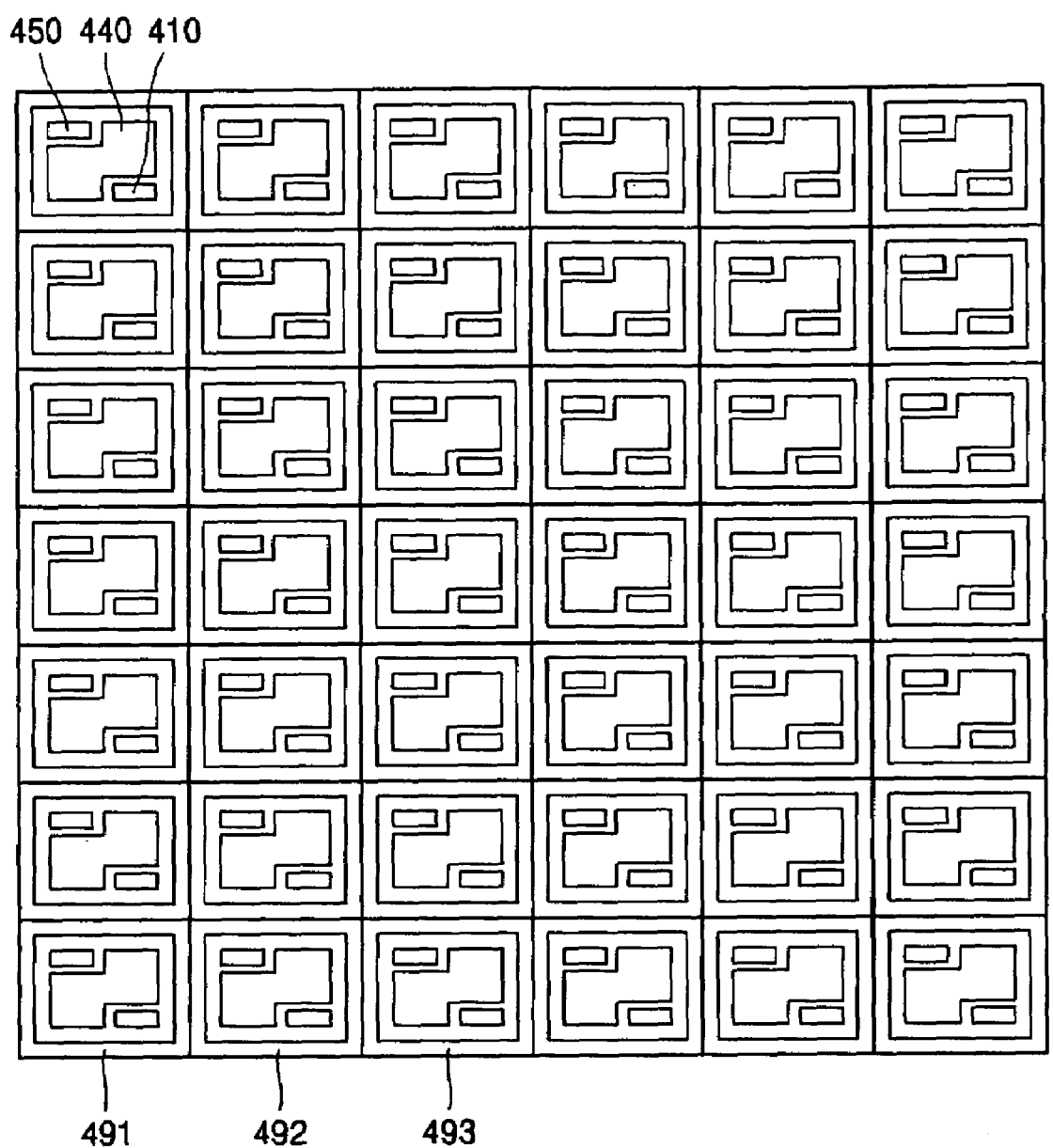
FIG. 12 is a schematic plan view of a part of sub-pixel units in the active matrix OEL display device that includes the OTFT according to a third embodiment of the present invention.

FIG. 12 is a schematic plan view of a part of sub-pixel units in the active matrix OEL display device including the OTFT according to a third embodiment of the present invention.

As described above, the OEL display device includes various pixel patterns for the various color of light emitted by the light emitting layer. For example, the device includes pixels that have red, green, and blue sub-pixels. Thus, the OEL device is a current-driving light emitting device that emits red, green, or blue light depending on the currents flowing between the both electrodes in order to display a predetermined image. The colors can be generated by making the light emitting layer of the intermediate layer in the OEL device emit red 491, green 492, or blue 493 light as shown in FIG. 12. The arrangement of the sub-pixels is not limited to the example shown in FIG. 12, and can also be arranged as stripes, mosaics, or delta arrangements. In addition, the OTFTs 410 and 450 and the storage capacitor 440 in the each sub-pixel unit are not limited to the examples shown in FIG. 12.

In order to make the light emitting layer emit red light, the sub-pixel 491 that has the red light emitting layer can be formed of poly(1,4-phenylenevinylene) derivative, Nile red, 4-(dicyanomethyelene)-2-methyl-6-(julolidine-4-yl-vinyl)-4H-pyran (dcm2), 2,3,7,8,12,13,17,18-octaethyl,21H,23H-porphine platinum (II) (PEOEP), and 4-(dicyanomethylene)-2-tertbuty 1-6-(1,1,7,7-tetramethyllulolidyl-9-enyl)-4H-pyran. The sub-pixel 492 that has the green light emitting layer can be formed of 10-(2-benzothoiazolyl)-2, 3,6,7-tetrahydro-1,1,7,7-tetramethyl-1H,5H,11H-[1]benzopyrano[6,7,8-ij]quinolizine (C545T), tri(8-hydroxyquinolato)aluminum (Alq3), tris(2-(2-pyridylphenyl)-C,N)) iridium(II) (Ir)ppy. In addition, the sub-pixel 493 that has the blue light emitting layer can be formed of fluorene-based polymer, spirofluorene-based polymer, carbazole-based low molecular weight such as dicarbazole stilbene (DCS) (also referred to as bis[carbazole-(9)]-stilbene, and 4,4'-bis(2,2'-diphenylenethen-1-yl)-N,N'-bis (phenyl)benzidine (a-NPD).

Figure 13:
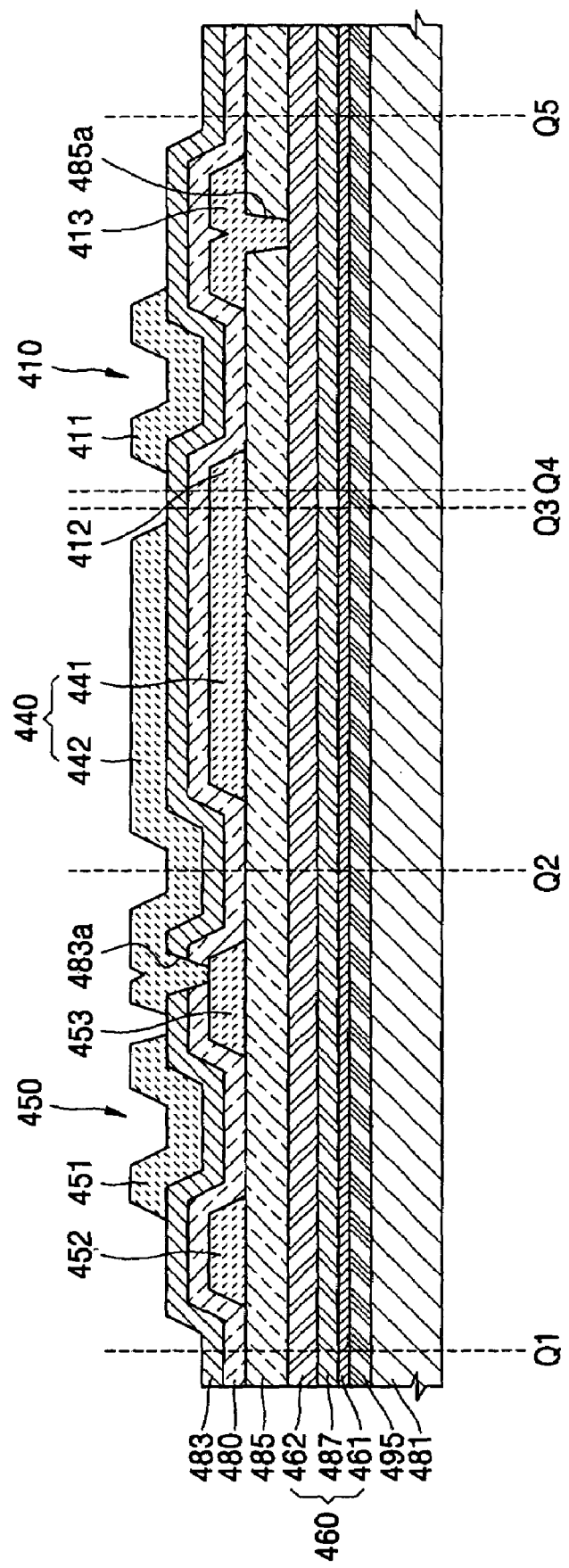
FIG. 13 is a schematic cross-sectional view of a sub-pixel unit of the active matrix OEL display device that includes an OTFT according to a fourth embodiment of the present invention.

FIG. 13 is a schematic cross-sectional view of a sub-pixel unit of the active matrix OEL display device that includes an OTFT according to a fourth embodiment of the present invention. Referring to FIG. 13, an OEL device including the counter electrode 461, the intermediate layer 487 including the light emitting layer, and the pixel electrode 462 is disposed on the substrate 481. Two staggered type p-type OTFTs 410 and 450, and the storage capacitor 440 are formed on the OEL device. In addition, the second electrode 413 of the first OTFT 410 is connected to the pixel electrode 462 of the OEL device. The above structure is the same as those of the above embodiments.

A difference between the OEL display devices according to the present embodiment and the third embodiment is that a color filter 495 is disposed between the substrate 481 and the counter electrode 461.

In the OEL display device according to the third embodiment, the light emitting layer included in the OEL device is formed of the material that emits red, green, or blue light. This allowed the full-color image to be displayed using the emitted lights. However, in the OEL display device according to the fourth embodiment, the light emitting layer is white, and the white light emitted from the light emitting layer passes through the color filter 495, so that red, green, or blue light can be emitted. Here, the white-color light may include all visible wavelengths of light, or may have a spectrum, in which a peak occurs at the wavelength corresponding to red, green, or blue colors.

Figure 14:
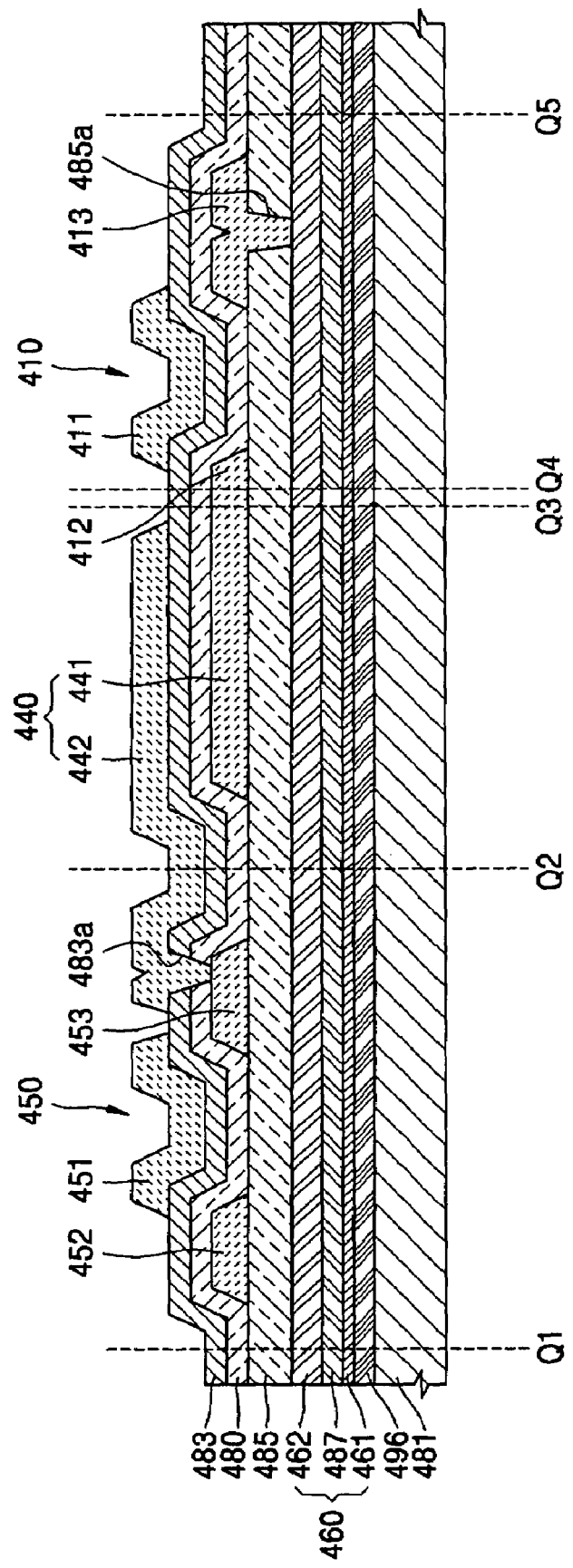
FIG. 14 is a schematic cross-sectional view of a sub-pixel unit in the active matrix OEL display device that includes an OTFT according to a fifth embodiment of the present invention.

FIG. 14 is a schematic cross-sectional view of a sub-pixel unit in the active matrix OEL display device including an OTFT according to a fifth embodiment of the present invention.

Referring to FIG. 14, an OEL device including the counter electrode 461, the intermediate layer 487 including the light emitting layer, and the pixel electrode 462 is disposed on the substrate 481. Two staggered type p-type OTFTs 410 and 450, and the storage capacitor 440 are formed on the OEL device. In addition, the second electrode 413 of the first OTFT 410 is connected to the pixel electrode 462 of the OEL device. The above structure is the same as those of the above embodiments.

A difference between the fifth embodiment and the above third and fourth embodiments is that a color conversion layer 496 is disposed between the substrate 481 and the counter electrode 461. In the OEL display device according to the present embodiment, the light emitting layer is formed as the blue light emitting layer, and the blue light emitted from the light emitting layer is converted into the red, green, or blue light through the color conversion layer 496, thus displaying a full-color image.

FIG. 15, FIG. 16, FIG. 17, and FIG. 18 are schematic cross-sectional views of processes for fabricating the active matrix OEL display device including the OTFT according to the present invention.

Referring to FIG. 15, the counter electrode 461 is formed on entire surface of the substrate 481 or at each sub-pixel on the substrate 481. The intermediate layer 487 having the light emitting layer is formed on the counter electrode by inkjet printing, the spin coating, or the thermal transfer method. After that, the pixel electrode 462 is formed at each sub-pixel on the intermediate layer 487. In addition, after forming the protective layer 485 on the pixel electrode 462, the first contact hole 485a exposing a part of the pixel electrode 462 is formed on the protective layer 485 of the each sub-pixel. The first contact hole 485a can be formed using a laser ablation technique (LAT).

After performing the above process, the second electrode 413 connected to the pixel electrode 462 through the first contact hole 485a, the first electrode 412 and the first capacitor electrode 441 formed integrally with each other, the fourth electrode 453, and the third electrode 452 are formed as shown in FIG. 16. The second electrode 413, the first electrode 412, the first capacitor electrode 441, the fourth electrode 453, and the third electrode 452 can be patterned in a deposition method using a shadow mask or by inkjet printing.

Figure 17:
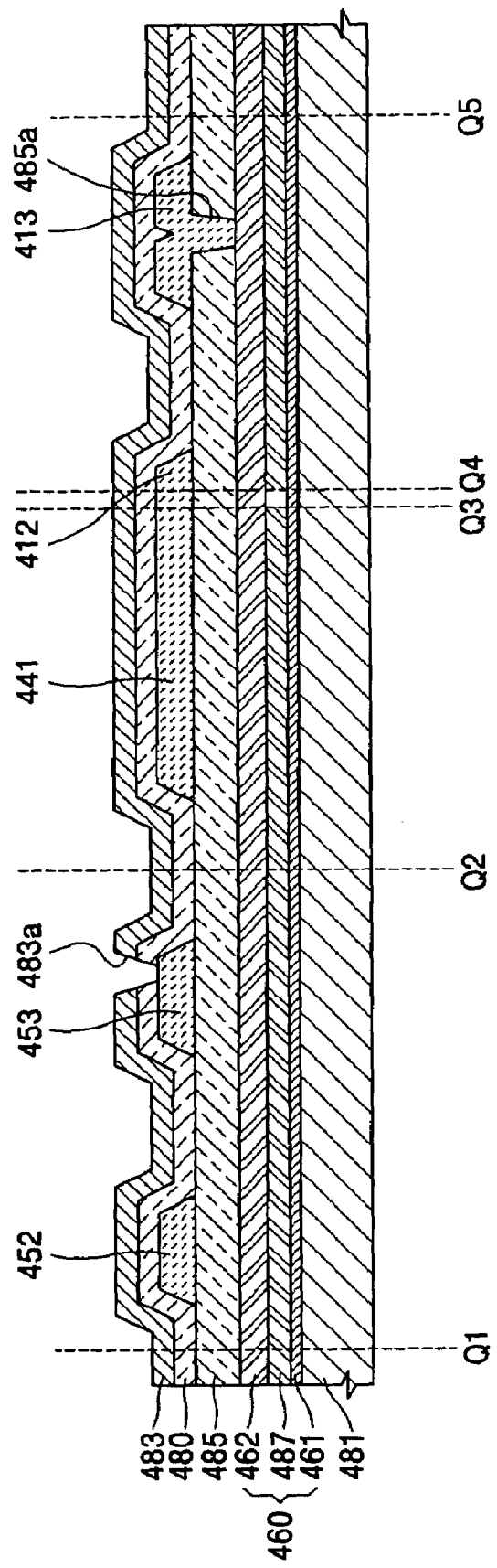

Next, the p-type organic semiconductor layer 480 covering the above electrodes is formed on the entire surface of the substrate 481 by vacuum deposition or a thermal evaporation method as shown in FIG. 17. In addition, the gate insulating layer is formed on the entire p-type organic semiconductor layer 480 using a spin coating method. The second contact hole 483a is formed in the p-type organic semiconductor layer 480 and the gate insulating layer 483 so that the fourth electrode 453 can be exposed. The second contact hole 483a can be formed in the LAT method.

Figure 18:
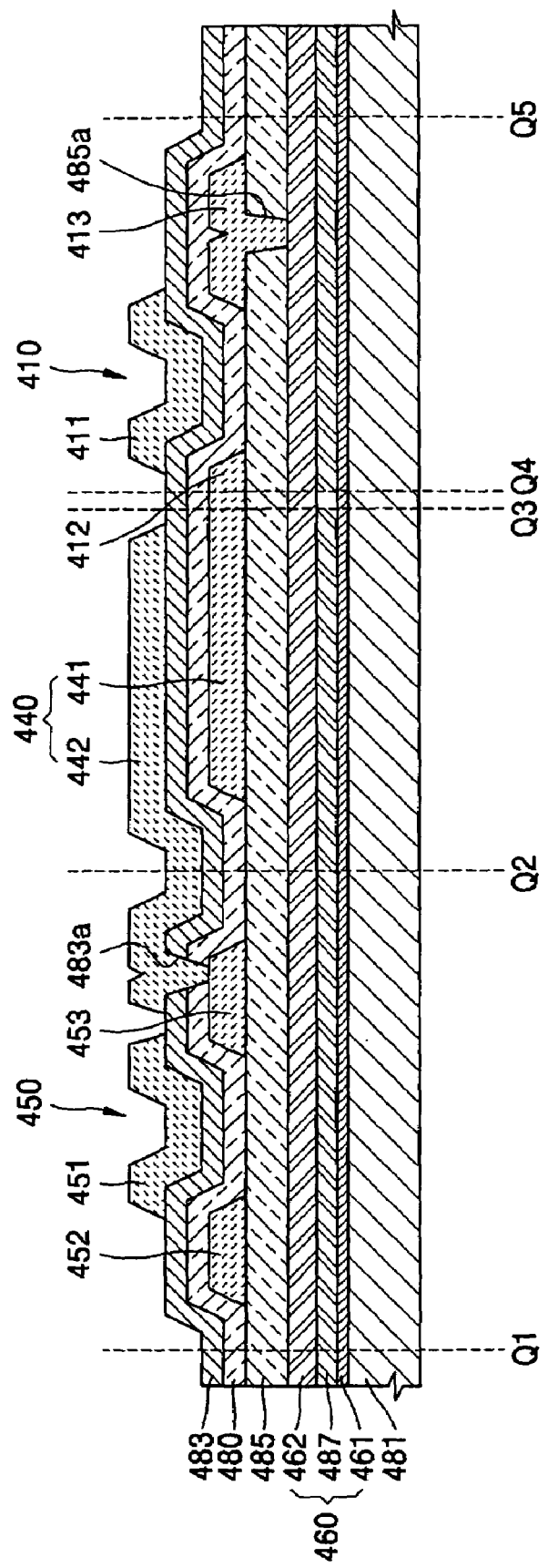

The first gate electrode 411 and second gate electrode 451 formed on the gate insulating layer 483. The second capacitor electrode 442 connected to the fourth electrode 453 through the second contact hole 483a and formed over the first capacitor electrode 441 are fabricated while being patterned in the deposition method using shadow mask or inkjet printing methods. Thus, the OEL display device including a p-type OTFT and the storage capacitor shown can be fabricated as shown in FIG. 18. A sealing member and a front substrate can be formed on the OEL devices and the OTFTs fabricated through the above processes.

The array of the OEL devices including the p-type OTFTs and the storage capacitor can be fabricated easily and thus can be mass-produced. The processes that are done after forming the OEL device 460 are performed by the evaporation or spin coating methods and can also be mass-produced through the above processes. For example, when the OTFT is disposed on the OEL device, the metal electrodes can be patterned by the deposition method using the shadow mask. In addition, the p-type organic semiconductor layer 480 can be formed by the spin coating or deposition methods, and the gate insulating layer can be formed by spin coating the surface with organic material. Therefore, the OEL display device with the above structure can be fabricated without damaging the OEL device disposed under the display device.

During fabrication, a process of forming the pixel definition layer can be further added between the process of forming the counter electrode 461 and the process of forming of the intermediate layer 487. In this case, after forming the counter electrode 461, the material of the pixel definition layer is applied on the counter electrode 461 over the entire substrate 481, and then, the material is patterned using the photolithography method and baked. The elements formed of the organic layers are not formed yet, thus the pixel definition layer can be formed in the above process.

In addition, a process of forming color filter that filters the white light into red, green, or blue color light on the substrate 481 can be further included. This can be done before forming the light emitting layer (the layer emitting white light) included in the intermediate layer 487 and forming the counter electrode 461. Otherwise, a process of forming the color conversion layer that converts the blue light into the red, green, or blue color light on the substrate 481 can be further included before forming the layer emitting the blue light and forming the counter electrode 461.

According to the OEL display device including the OTFTs and the method of fabricating the display device of the present invention, the following effects can be obtained.

Since the p-type OTFT is formed on the OEL device, an aperture ratio of approximately 100% can be obtained.

In addition, since the aperture ratio is approximately 100%, the electric current applied to the OEL device for obtaining a predetermined brightness can be reduced, thereby reducing the power consumption and increasing the lifespan of the OEL device.

It is desirable that the size of the OTFT is large in order to increase the on-current level of the OTFT. According to the present invention, the OTFT is located on the upper portion of the OEL device, thus a sufficiently large OTFT can be formed without reducing the aperture ratio.

In addition, since the OTFT is formed in staggered configuration, the structure can be simplified and the yield can be improved.

Since an active matrix OEL device can be easily produced in the array form, the fabrication costs can be reduced by mass-producing the devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An active matrix organic electroluminescent display device including an organic thin-film transistor, the display device comprising:
   a counter electrode;
   an intermediate layer including at least a light emitting layer on the counter electrode;
   a pixel electrode formed on the intermediate layer;
   a first electrode disposed on the pixel electrode and insulated from the pixel electrode;
   a second electrode disposed on the pixel electrode and connected to the pixel electrode;
   a p-type organic semiconductor layer contacting the first electrode and a first drain electrode; and
   a first gate electrode disposed on the p-type organic semiconductor layer and insulated from the first electrode, the first drain electrode, and the p-type organic semiconductor layer.

2. The display device of claim 1, wherein a protective layer is formed on the pixel electrode,
   wherein the first electrode and the second electrode are formed on the protective layer, and
   wherein the second electrode is connected to the pixel electrode through a contact hole formed on the protective layer.

3. The display device of claim 1, wherein a gate insulating layer is formed on the p-type organic semiconductor layer, and
   wherein the first gate electrode is formed on the gate insulating layer.

4. The display device of claim 3, wherein the gate insulating layer is formed of an organic material.

5. The display device of claim 1, further comprising:
   a capacitor;
   a fourth electrode connected to the second capacitor electrode;
   an organic semiconductor layer contacting the fourth electrode;

a third electrode contacting the organic semiconductor layer; and a second gate electrode insulated from the fourth electrode, the third electrode, and the organic semiconductor layer, wherein the capacitor includes a first capacitor electrode connected to the first electrode, and a second capacitor electrode facing the first capacitor electrode and connected to the first gate electrode.

6. The display device of claim 5, wherein the first drain electrode, the first electrode, the first capacitor electrode, the fourth electrode, and the third electrode are each disposed on the same plane, and wherein the first gate electrode, the second capacitor electrode, and the second gate electrode are each disposed on the same plane.

7. The display device of claim 1, wherein the counter electrode is a transparent electrode, and wherein the pixel electrode is a reflective electrode.

8. The display device of claim 1, wherein a pixel definition layer is disposed on the counter electrode.

9. The display device of claim 1, wherein the light emitting layer included in the intermediate layer emits red, green, or blue light.

10. The display device of claim 1, wherein the light emitting layer is the layer emitting white light, and wherein a color filter that filters the white light emitted from the light emitting layer into the red, green, or blue light.

11. The display device of claim 1, wherein the light emitting layer emits blue light, and wherein a color conversion layer converts the blue light emitted from the light emitting layer into the red, green, or blue light is further disposed between the counter electrode and the intermediate layer including the light emitting layer.

12. A method for fabricating an active matrix organic electroluminescent display device including an organic thin-film transistor, comprising:

forming a counter electrode on an entire surface of a substrate or in a predetermined pattern;

forming an intermediate layer including at least a light emitting layer on the counter electrode;

forming a pixel electrode of a predetermined pattern on the intermediate layer;

forming a protective layer covering the pixel electrode on the entire surface of the substrate;

forming a first contact hole on the protective layer so as to expose the pixel electrode;

forming a second electrode connected to the pixel electrode through the first contact hole, a first electrode and a first capacitor electrode formed integrally with each other, a fourth electrode, and a third electrode on the protective layer;

forming a p-type organic semiconductor layer covering the electrodes on the entire surface of the substrate;

forming a gate insulating layer on the p-type organic semiconductor layer entirely over the substrate;

forming a second contact hole in the p-type organic semiconductor layer and the gate insulating layer so as to expose the fourth electrode; and forming a first gate electrode, a second capacitor electrode connected to the fourth electrode through the second contact hole, and a second gate electrode on the gate insulating layer.

13. The method of claim 12, further comprising:

forming a pixel definition layer after forming the counter electrode and before forming the intermediate layer.

14. The method of claim 12, further comprising:

forming a pixel pattern corresponding to the light emitting layer.

15. The method of claim 12, wherein the light emitting layer emits the white light, and wherein the method further comprises forming a color filter filtering the white light emitted from the light emitting layer into the red, green, or blue light on the substrate before forming the counter electrode.

16. The method of claim 12, wherein the light emitting layer emits blue light, and wherein the method further comprises forming a color conversion layer that converts blue light emitted from the light emitting layer into red, green, or blue light on the substrate before forming the counter electrode.

* * * * *